(12) United States Patent
Shiliang et al.

(10) Patent No.: US 11,996,460 B2
(45) Date of Patent: May 28, 2024

(54) SEMICONDUCTOR STRUCTURE AND FORMING METHOD FOR THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Ji Shiliang, Shanghai (CN); Xiao Xingyu, Shanghai (CN); Zhang Haiyang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 421 days.

(21) Appl. No.: 17/470,129

(22) Filed: Sep. 9, 2021

(65) Prior Publication Data

US 2022/0102520 A1    Mar. 31, 2022

(30) Foreign Application Priority Data

Sep. 30, 2020   (CN) .......................... 202011065279.3

(51) Int. Cl.
 *H01L 29/423* (2006.01)
 *H01L 29/06* (2006.01)
 (Continued)

(52) U.S. Cl.
 CPC .... *H01L 29/42392* (2013.01); *H01L 29/0673* (2013.01); *H01L 29/401* (2013.01);
 (Continued)

(58) Field of Classification Search
 CPC .......... H01L 29/42392; H01L 29/0673; H01L 29/401; H01L 29/41775; H01L 23/5286;
 (Continued)

(56) References Cited

U.S. PATENT DOCUMENTS

| 2022/0181259 A1* | 6/2022 | Chiang | ............ H01L 29/66742 |
| 2022/0367454 A1* | 11/2022 | Chung | ................ H01L 27/0688 |
| 2023/0163197 A1* | 5/2023 | Kao | .................. H01L 29/66553 257/347 |

\* cited by examiner

*Primary Examiner* — Shahed Ahmed
(74) *Attorney, Agent, or Firm* — Crowell & Moring LLP

(57) ABSTRACT

A semiconductor structure and a forming method thereof are provided, where one form of a forming method includes: providing a substrate, where the substrate includes a first region and a second region that are adjacent, stack structures are formed on the first region and the second region, and the stack structures of the first region and the second region and the substrate form a first opening; forming first dielectric layers on a bottom surface and side walls of the first opening, where a second opening is provided between the first dielectric layers; forming a second dielectric layer in the second opening; forming a source/drain doped layer; removing the first dielectric layer between the source/drain doped layer and the second dielectric layer, and forming a groove exposing a side wall, which is close to the second dielectric layer, of the source/drain doped layer; and forming a contact plug in the groove. In the embodiments of the present disclosure, the contact plug is in contact with a top surface of the source/drain doped layer as well as the side walls, which are close to the second dielectric layer and away from the second dielectric layer respectively, of the source/drain doped layer, so that a contact resistance between the contact plug and the source/drain doped layer is relatively small, thereby improving the electrical performance of the semiconductor structure.

19 Claims, 9 Drawing Sheets

(51) Int. Cl.
*H01L 29/40* (2006.01)
*H01L 29/417* (2006.01)
*H01L 29/66* (2006.01)
*H01L 29/786* (2006.01)

(52) U.S. Cl.
CPC .. *H01L 29/41775* (2013.01); *H01L 29/66545* (2013.01); *H01L 29/78696* (2013.01)

(58) Field of Classification Search
CPC ........... H01L 23/535; H01L 21/823481; H01L 29/7848; H01L 29/66439; H01L 29/775; H01L 29/41783; H01L 21/8238–823892; H01L 27/092–0928; H01L 29/04–045; H01L 29/16–1608; H01L 21/823418; B82Y 10/00
See application file for complete search history.

SEMICONDUCTOR STRUCTURE AND FORMING METHOD FOR THEREOF

RELATED APPLICATIONS

The present application claims priority to Chinese Patent Appln. No. 202011065279.3, filed Sep. 30, 2020, the entire disclosure of which is hereby incorporated by reference.

BACKGROUND

Technical Field

Embodiments of the present disclosure relate to the field of semiconductor manufacturing, and in particular, to a semiconductor structure and a forming method thereof.

Related Art

During semiconductor manufacturing, with the development tendency of ultra-large-scale integrated circuits, a feature dimension of an integrated circuit is continuously reduced. To adapt to the smaller feature dimension, a channel length of a metal-oxide-semiconductor field-effect transistor (MOSFET) is also continuously reduced.

To better meet a requirement of proportional reduction in a device size, semiconductor design has gradually transitioned from a planar transistor to a three-dimensional transistor with higher efficacy, such as a nanowire transistor. In the nanowire transistor, a gate surrounds a region in which a channel is located. Compared with the planar transistor, the gate of the nanowire transistor has a stronger channel control capability and can better suppress a short-channel effect.

To further improve the integration degree of the semiconductor structure, a forksheet transistor may be provided, which is an option that comes after FinFET and nanowire transistors. In the forksheet transistor, a dielectric wall is used for isolation due to the complex bilateral finned structure.

SUMMARY

A problem to be addressed in embodiments and implementations of the present disclosure is to provide a semiconductor structure and a forming method thereof, to reduce a contact resistance between a contact plug and a source/drain doped layer and optimize the electrical performance of the semiconductor structure.

To address the problem, the present disclosure provides a method for forming a semiconductor structure. In one form, a method includes: providing a substrate, where the substrate includes a first region and a second region that are spaced apart, stack structures that are formed on the first region and the second region, and a first opening that is formed between the stack structure of the first region and the stack structure of the second region; forming first dielectric layers on side walls of the first opening, where a second opening is provided between the first dielectric layers; forming a second dielectric layer in the second opening; forming a source/drain doped layer and an interlayer dielectric layer covering the source/drain doped layer in the stack structure after the second dielectric layer is formed; etching the interlayer dielectric layer to form a trench, where the trench exposes a top surface and a side wall, which is away from the second dielectric layer, of the source/drain doped layer; removing the first dielectric layer between the source/drain doped layer and the second dielectric layer after the trench is formed, to form a groove; and forming a contact plug in the trench and the groove.

The present disclosure further provide a semiconductor structure. In one form, a semiconductor structure includes: a substrate, where the substrate includes a first region and a second region that are spaced apart; a first dielectric wall, located on the substrate between the first region and the second region; source/drain doped layers, separated on the substrate of the first region and the second region along an extension direction of the first dielectric wall, where the source/drain doped layers are spaced apart from the first dielectric wall; and a contact plug, located between the source/drain doped layer and the first dielectric wall and covering a top surface of the source/drain doped layer and a side wall, which is away from the first dielectric wall, of the source/drain doped layer.

Compared with the prior art, technical solutions of embodiments and implementations of the present disclosure have at least the following advantages.

In forms of a forming method of a semiconductor structure provided in embodiments and implementations of the present disclosure, the stack structures of the first region and the second region and the substrate form a first opening, first dielectric layers are formed on side walls of the first opening, and a second opening is provided between the first dielectric layers. The second dielectric layer is formed in the second opening, a source/drain doped layer and an interlayer dielectric layer covering the source/drain doped layer are formed in the stack structure, and the source/drain doped layer of the first region and the source/drain doped layer of the second region are correspondingly spaced apart by the first dielectric layers and the second dielectric layer. The interlayer dielectric layer is etched to form a trench, where the trench exposes a top surface and a side wall, which is away from the second dielectric layer, of the source/drain doped layer. The first dielectric layer between the source/drain doped layer and the second dielectric layer is removed to form a groove, and the groove exposes a side wall, which is close to the second dielectric layer, of the source/drain doped layer. In a process of forming a contact plug in the trench and the groove, the contact plug is in contact with the top surface of the source/drain doped layer as well as the side walls, which are close to the second dielectric layer and away from the second dielectric layer respectively, of the source/drain doped layer. There is a relatively large contact area between the contact plug and the source/drain doped layer, so that a contact resistance between the contact plug and the source/drain doped layer is relatively small, thereby improving the electrical performance of the semiconductor structure.

DETAILED DESCRIPTION

It will be appreciated from the background that currently, formed semiconductor devices may have poor performance.

Reasons for the poor performance of the devices are analyzed with reference to a forming method of a semiconductor structure.

Figure 1:
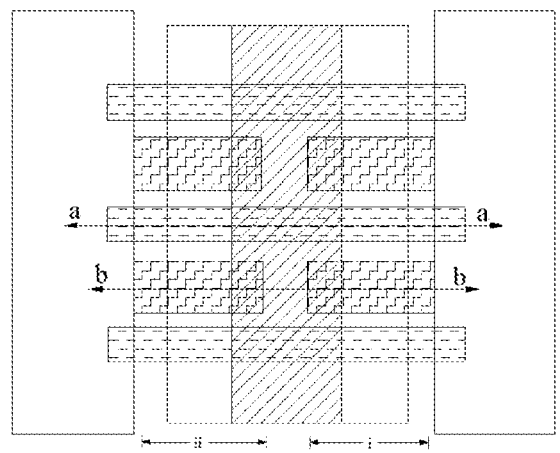
FIG. 1 to FIG. 3 are schematic structural diagrams corresponding to steps in a method for forming a semiconductor structure.
Figure 2:
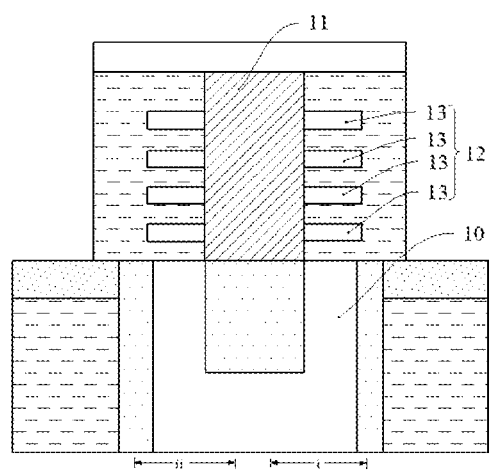
Figure 3:
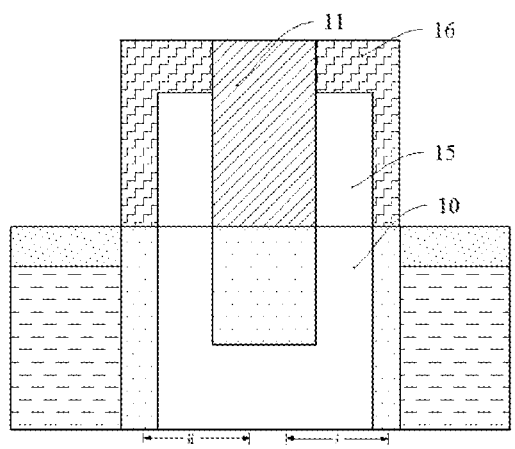

FIG. 1 to FIG. 3 are schematic structural diagrams corresponding to steps in a forming method of a semiconductor structure.

As shown in FIG. 1 to FIG. 3, FIG. 2 is a cross-sectional view of FIG. 1 along line a-a, and FIG. 3 is a cross-sectional view of FIG. 1 along line b-b. A substrate 10 is provided, and the substrate 10 includes a first region i and a second region ii; channel structures 12 are separated in the first region i and the second region ii and suspended above the substrate 10, and the channel structure 12 includes a plurality of channel layers 13 spaced apart in a normal direction of a surface of the substrate 10; a dielectric wall 11 is located between the channel structure 12 of the first region i and the channel structure 12 of the second region ii; a gate structure 14 is across the channel structures 12 and the dielectric wall 11 and covers the channel layers 13, and an extension direction of the gate structure 14 is a lateral direction; source/drain doped layers 15 are located at two sides of the gate structure 14, and the source/drain doped layers 15 are in contact with two ends of the channel layer 13 in an extension direction; a contact plug 16 is located on a top surface and a side wall of the source/drain doped layer 15.

The dielectric wall 11 is located between the source/drain doped layer 15 of the first region i and the source/drain doped layer 15 of the second region ii. The contact plug 16 is in contact with the top surface of the source/drain doped layer 15 and the side wall, which is away from the dielectric wall 11, of the source/drain doped layer 15. There is a relatively small contact area between the contact plug 16 and the source/drain doped layer 15. When the semiconductor structure is working, the on-resistance between the contact plug 16 and the source/drain doped layer 15 is relatively large, resulting in poor electrical performance of the semiconductor structure.

To address the technical problem, a method for forming a semiconductor structure is provided. The stack structures of the first region and the second region and the substrate form a first opening. First dielectric layers are formed on side walls of the first opening, and a second opening is provided between the first dielectric layers. The second dielectric layer is formed in the second opening. A source/drain doped layer and an interlayer dielectric layer covering the source/drain doped layer are formed in the stack structure. The source/drain doped layer of the first region and the source/drain doped layer of the second region are correspondingly spaced apart by the first dielectric layers and the second dielectric layer. The interlayer dielectric layer is etched to form a trench. The trench exposes a top surface and a side wall, which is away from the second dielectric layer, of the source/drain doped layer. The first dielectric layer between the source/drain doped layer and the second dielectric layer is removed to form a groove, and the groove exposes a side wall, which is close to the second dielectric layer, of the source/drain doped layer. In a process of forming a contact plug in the trench and the groove, the contact plug is in contact with the top surface of the source/drain doped layer as well as the side walls, which are close to the second dielectric layer and away from the second dielectric layer respectively, of the source/drain doped layer, and there is a relatively large contact area between the contact plug and the source/drain doped layer, so that a contact resistance between the contact plug and the source/drain doped layer is relatively small, thereby improving the electrical performance of the semiconductor structure.

To make the foregoing objectives, features, and advantages of the embodiments and the implementations of the present disclosure more apparent and easier to understand, specific embodiments and implementations of the present disclosure are described in detail below with reference to the accompanying drawings.

FIG. 4 to FIG. 23 are schematic structural diagrams corresponding to steps in one form of a method for forming a semiconductor structure according to the present disclosure.

Figure 4:
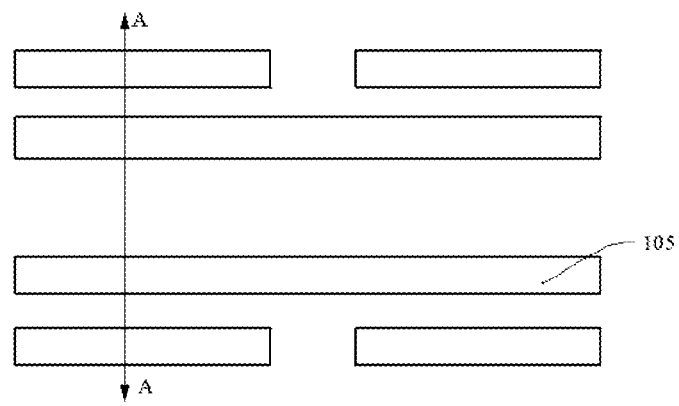
FIG. 4 to FIG. 23 are schematic structural diagrams corresponding to steps in one form of a method for forming a semiconductor structure according to the present disclosure.
Figure 5:
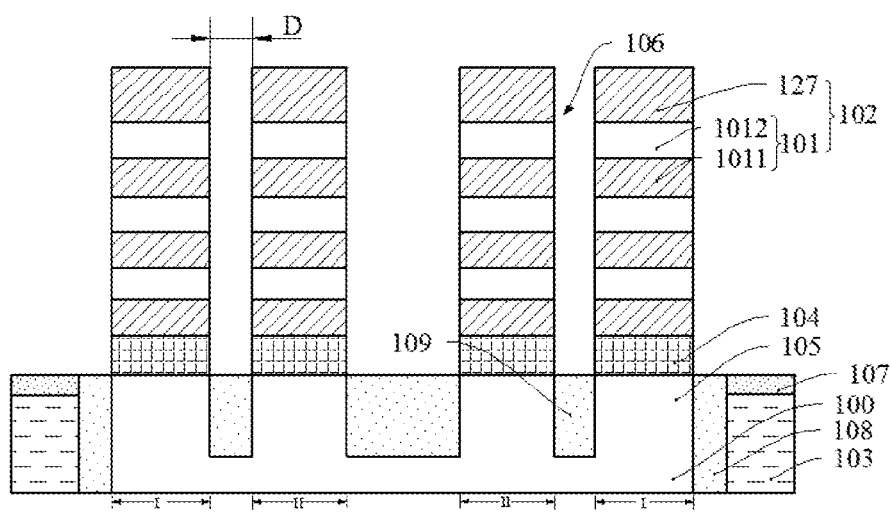

Referring to FIG. 4 and FIG. 5, FIG. 4 is a top view of a semiconductor structure, and FIG. 5 is cross-sectional view of FIG. 4 along line A-A. A substrate 100 is provided. The substrate 100 includes a first region I and a second region II that are spaced apart, stack structures 102 are formed on the first region I and the second region II, and a first opening 106 is formed between the stack structure 102 of the first region I and the stack structure 102 of the second region II.

In some implementations, the first region I is used for forming a first-type transistor thereon, and the second region II is used for forming a second-type transistor thereon. Conductivity types of the first-type transistor and the second-type transistor are different. Specifically, the first-type transistor is a positive channel metal oxide semiconductor (PMOS), and the second-type transistor is a negative channel metal oxide semiconductor (NMOS).

The substrate 100 is used for providing a process platform for subsequent formation of a forksheet transistor.

In some implementations, the substrate 100 is a silicon substrate. In other implementations, a material of the substrate may alternatively be germanium, silicon germanide, silicon carbide, gallium arsenide, indium gallide, or the like. The substrate may alternatively be a substrate of another type, such as a silicon substrate on an insulator or a germanium substrate on an insulator.

It should be noted that the substrate 100 includes a plurality of device regions spaced apart, and the first region I and the second region II are located in the device region. In some implementations, regions close to each other in adjacent device regions are both first regions I or both second regions II. In other implementations, alternatively, one of the regions close to each other in the adjacent device regions may be a first region and the other may be a second region.

In the step of providing the substrate 100, fins 105 are formed between the stack structure 102 and the substrate 100.

In some implementations, a material of the fins 105 is the same as the material of the substrate 100. In other implementations, the material of the fins may alternatively be different from the material of the substrate.

The fins 105 are used for spacing the channel stack 101 apart from the substrate 100 and provide a process space for forming an isolation structure on the substrate 100 between the fins 105.

In the step of providing the substrate 100, the stack structure 102 includes a plurality of channel stacks 101, and the channel stack 101 includes a sacrificial layer 1011 and a channel layer 1012 located on the sacrificial layer 1011.

The channel stack 101 is used for providing a process basis for subsequent suspension arrangement of the channel layer 1012. The sacrificial layer 1011 is used for supporting the channel layer 1012, to provide process conditions for the subsequent suspension arrangement of the channel layers 1012 at intervals, and is also used for occupying a spatial position for the subsequently formed gate structure.

When the semiconductor structure is working, the channel layer 1012 is used as a channel region.

In some implementations, the etching of the channel layer 1012 is more difficult than that of the sacrificial layer 1011. When the sacrificial layer 1011 is subsequently removed, the channel layer 1012 is not easily damaged.

In some implementations, a material of the channel layer 1012 includes silicon, and a material of the sacrificial layer 1011 includes silicon germanium. In other implementations, the material of the channel layer may alternatively be germanium, silicon germanium, silicon carbide, gallium arsenide, indium gallium or the like, and the material of the sacrificial layer may alternatively be silicon correspondingly.

It should be noted that the stack structure 102 further includes a top sacrificial layer 127. The top sacrificial layer 127 and the sacrificial layer 1011 occupy a spatial position for subsequent formation of the gate structure, so that the gate structure subsequently formed on the channel layer 1012 at the top is relatively thick. When the semiconductor structure is working, the gate structure has a relatively strong capability of controlling the channel layer 1012 at the top, thereby improving the electrical performance of the semiconductor structure.

In some implementations, the first opening 106 provides a process space for subsequent formation of first dielectric layers and a second dielectric layer.

It should be noted that, in the step of providing the substrate 100, a bottom sacrificial layer 104 is formed between the stack structure 102 and the fin 105.

The bottom sacrificial layer 104 provides a spatial position for subsequent formation of an isolation layer.

The etching resistance of the bottom sacrificial layer 104 is lower than that of the sacrificial layer 1011, and in a subsequent step of removing the bottom sacrificial layer 104, the sacrificial layer 1011 is not easily damaged, so that a formation region of the gate structure is not easily reduced.

Specifically, a material of the bottom sacrificial layer 104 includes silicon germanium, and the concentration of germanium ions in the bottom sacrificial layer 104 is greater than that in the sacrificial layer 1011.

In some implementations, in the step of proving the substrate 100, a power rail line 103 is further formed in the substrate 100, the power rail line 103 is an elongated structure, and the power rail line 103 is parallel to an extension direction of the stack structure 102.

The power rail line 103 is used for supplying power to different components of a chip. In some implementations the power rail line 103 is located in the substrate 100. The power rail line 103 is a buried power rail (BPR), which is beneficial to releasing wiring resources that are interconnected in a back end of line (BEOL) and reducing a height of a standard cell, to meet a requirement of continuous miniaturization of logic chips. In addition, the BPR uses a technology of increasing a BEOL resistance by reducing a pitch, which is also beneficial to providing a lower resistive local distribution of the current.

A material of the power rail line 103 is a conductive material. In some implementations, the material of the power rail line 103 is a metal material, including one or more of Co, W, Ni, and Ru. The material of the power rail line 103 has a relatively low resistivity, which is beneficial to alleviating RC delay and improving a processing speed of a chip.

In some implementations, a cap layer 107 is formed on the top of the power rail line 103.

During formation of the semiconductor structure, the cap layer 107 is used for protecting the power rail line 103 from being easily damaged.

Specifically, a material of the cap layer 107 includes one or more of silicon nitride, silicon oxynitride, silicon carbide, silicon carbonitride, boron nitride, boron nitride silicon, and boron carbon silicon nitride. In some implementations, the material of the cap layer 107 includes silicon nitride.

In some implementations, an insulation layer 108 is further formed between a side wall of the power rail line 103 and the substrate 100, and the insulation layer 108 is used for implementing insulation between the power rail line 103 and the substrate 100. Therefore, the material of the insulation layer 108 is an insulation material, for example, silicon oxide, silicon oxynitride, or silicon nitride.

In some implementations, in the step of providing the substrate 100, an isolation structure 109 is formed on the substrate 100 between the fins 105, and a top surface of the isolation structure 109 is lower than or flush with a bottom surface of the bottom sacrificial layer 104.

The top of the isolation structure 109 is lower than or flush with a top surface of the fin 105, so that a process window for subsequently removing the bottom sacrificial layer 104 is relatively large.

The isolation structure 109 is used for electrically isolating the adjacent fins 105. In some implementations, a material of the isolation structure 109 includes silicon oxide.

Specifically, the first opening 106 is defined by the isolation structure 109, the stack structures 102, and the bottom sacrificial layers 104.

Figure 6:
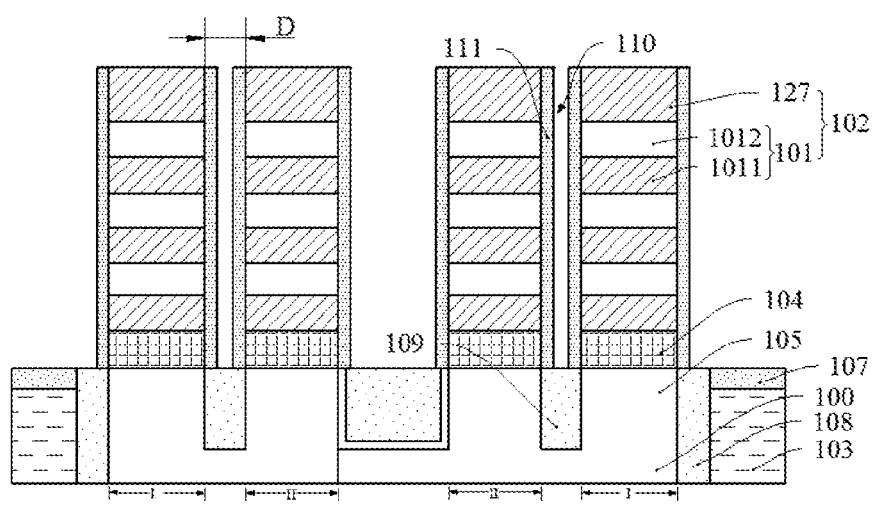

Referring to FIG. 6, first dielectric layers 111 are formed on side walls of the first opening 106, and there is a second opening 110 between the first dielectric layers 111.

The second opening 110 provides a process space for subsequent formation of a second dielectric layer. The first dielectric layer 111 occupies a region for forming a groove subsequently.

In some implementations, the etching resistance of the first dielectric layer 111 is lower than that of the second dielectric layer, and in a subsequent step of removing the first dielectric layer 111, the second dielectric layer is not easily damaged.

Specifically, a material of the first dielectric layer 111 includes one or two of silicon oxide and silicon oxynitride. In some implementations, the material of the first dielectric layer 111 includes silicon oxide. Silicon oxide, with relatively small stress, is a low-cost dielectric material commonly used in the process, and has relatively high process compatibility, which is beneficial to reducing the process difficulty and process costs of forming the first dielectric layer 111.

It should be noted that the density of the first dielectric layer 111 is less than that of the isolation structure 109, so that in a subsequent process of removing the first dielectric layer 111, the isolation structure 109 is not easily damaged.

It should be noted that in the step of forming the first dielectric layers 111, a direction parallel to a surface of the substrate 100 and perpendicular to an extension direction of the stack structure 102 is a lateral direction, and a lateral dimension of the first dielectric layer 111 should not be excessively large or small. A second dielectric layer is subsequently formed in the second opening 110, and a source/drain doped layer and an interlayer dielectric layer covering the source/drain doped layer are formed in the stack structure 102; the interlayer dielectric layer is etched to form a trench, and the trench exposes a top surface and a side wall, which is away from the second dielectric layer, of the source/drain doped layer; and the first dielectric layer between the source/drain doped layer and the second dielectric layer is removed after the trench is formed, to form a groove, and the groove exposes a side wall, which is close to the second dielectric layer, of the source/drain doped layer; and a contact plug is formed in the trench and the groove. If the lateral dimension of the first dielectric layer 111 is excessively small, the first dielectric layer 111 between the source/drain doped layer and the second dielectric layer is not easily removed, and the corresponding groove is not easily formed. In a process of forming the contact plug, the contact plug is not easily formed between the second dielectric layer and the source/drain doped layer. As a result, the contact plug is only in contact with the top surface of the source/drain doped layer and the side wall, which is away from the second dielectric layer, of the source/drain doped layer, a contact area between the contact plug and the source/drain doped layer is relatively small, and a contact resistance between the contact plug and the source/drain doped layer is relatively large, resulting in poor electrical performance of the semiconductor structure. With an excessively large lateral dimension, the first dielectric layer 111 occupies an excess portion of the lateral dimension of the first opening 106, causing a lateral dimension of the second opening 110 to be excessively small. Correspondingly, a lateral dimension of the second dielectric layer subsequently formed in the second opening 110 is excessively small. The second dielectric layer has a relatively poor effect of electrically isolating the contact plug in the first region I from the contact plug in the second region II subsequently, and the contact plug in the first region I and the contact plug in the second region II are easily bridged, resulting in poor electrical performance of the semiconductor structure. In some implementations, in the step of forming the first dielectric layers 111, the lateral dimension of the first dielectric layer 111 is 3 nm to 20 nm.

In some implementations, the first dielectric layers 111 are formed on the side walls of the first opening 106, and correspondingly, a part of the isolation structure 109 between the stack structure 102 of the first region I and the stack structure 102 of the second region II is exposed, so that the second dielectric layer subsequently formed in the second opening 111 is in contact with the isolation structure 109. In a subsequent process of removing the first dielectric layer 111 between the source/drain doped layer and the second dielectric layer, a passage making the source/drain doped layer of the first region I be in communication with the source/drain doped layer of the second region II is not easily formed at the bottom of the second dielectric layer. Correspondingly, in a process of forming the contact plug in the trench and the groove, the second dielectric layer makes the contact plug of the first region I and the contact plug of the second region II difficult to bridge, thereby improving the electrical performance of the semiconductor structure.

The step of forming the first dielectric layers 111 includes: forming a first dielectric material layer (not shown in the figure) conformally covering the side walls and a bottom surface of the first opening 106; and removing the first dielectric material layer on the bottom surface of the first opening 106, and using the remaining first dielectric material layer on the side walls of the first opening 106 as the first dielectric layers 111.

In some implementations, the first dielectric material layer is formed by using an atomic layer deposition (ALD) process. The ALD process includes a plurality of cycles of atomic layer deposition, which is beneficial to improving the thickness uniformity of the first dielectric material layer, so that the first dielectric material layer can conformally cover the bottom surface and the side walls of the first opening 106. In addition, the ALD process has good gap filling performance and step coverage performance. In other implementations, the first dielectric material layer may alternatively be formed by using a chemical vapor deposition (CVD) process.

In some implementations, the first dielectric material layer on the bottom surface of the first opening 106 is removed using a dry etching process. Specifically, a maskless dry etching process is used. The maskless dry etching process has the characteristic of anisotropic etching, helping to ensure that the first dielectric material layer at the bottom of the first opening 106 is completely removed and the damage to other film layer structures is relatively small, and helping to avoid lateral etching of the first dielectric material layer, so that the lateral dimension of the first dielectric layer 111 is relatively large. In a subsequent process, the first dielectric layer 111 is easily removed, which is beneficial to improving formation quality of the groove, and formation quality of the contact plug correspondingly formed in the groove is relatively good, so that the contact resistance between the source/drain doped layer and the contact plug is relatively small, thereby improving the electrical performance of the semiconductor structure. In addition, the maskless dry etching process can save one mask, thereby reducing process costs of forming the first dielectric layer 111.

Specifically, in some implementations, the second opening 110 is surrounded by the isolation structure 109 and the first dielectric layers 111.

It should be noted that in the step of forming the first dielectric material layer using the ALD process, the first dielectric material layer is alternatively formed on a top surface and a side wall, which is away from the second opening 110, of the stack structure 102.

Correspondingly, the first dielectric layer 111 is alternatively formed on a side wall, which is away from the first opening 110, of the stack structure 102.

In other implementations, in the step of forming the first dielectric layers on the side walls of the first opening, the first dielectric layer is further formed on a bottom surface of the first opening.

The first dielectric layers on the side walls and the bottom surface of the first opening may be formed in one step, and a step of removing the first dielectric layer on the bottom surface of the first opening is omitted, thereby simplifying the process step and improving formation efficiency of the semiconductor structure.

Figure 7:
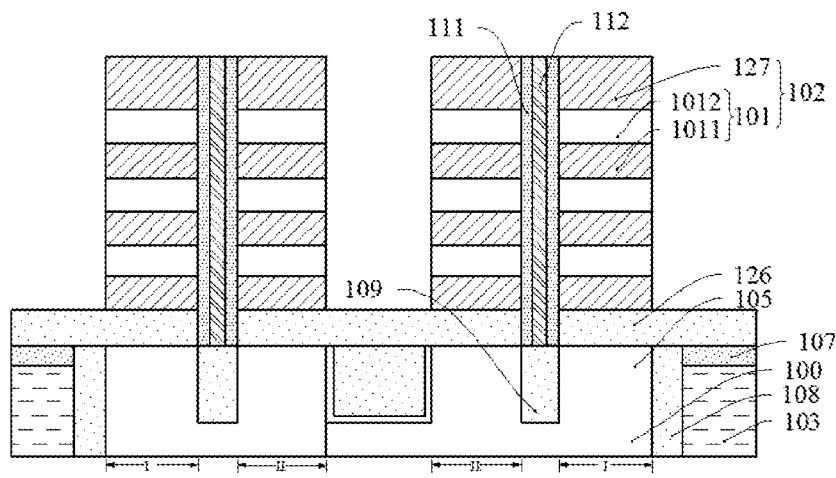

Referring to FIG. 7, a second dielectric layer 112 is formed in the second opening 110.

A source/drain doped layer and an interlayer dielectric layer covering the source/drain doped layer are subsequently formed in the stack structure 102, and the source/drain doped layer of the first region I and the source/drain doped layer of the second region II are correspondingly spaced apart by the first dielectric layers 111 and the second dielectric layer 112; the interlayer dielectric layer is etched to form a trench, and the trench exposes a top surface and a side wall, which is away from the second dielectric layer 112, of the source/drain doped layer; and the first dielectric layer between the source/drain doped layer and the second dielectric layer is removed after the trench is formed, to form a groove, and the groove exposes a side wall, which is close to the second dielectric layer 112, of the source/drain doped layer; and a contact plug is formed in the trench and the groove. The second dielectric layer 112 is used for electrically isolating the contact plug in the first region I from the contact plug in the second region II, so that the contact plug in the first region I and the contact plug in the second region II are not easily bridged, thereby improving the electrical performance of the semiconductor structure.

Specifically, a material of the second dielectric layer 112 includes one or more of silicon nitride, silicon oxynitride, silicon carbide, silicon carbonitride, boron nitride, boron nitride silicon, and boron carbon silicon nitride. In some implementations, the material of the second dielectric layer 112 includes silicon nitride, and silicon nitride is a dielectric material commonly used in the process, thereby improving process compatibility of the second dielectric layer 112 and reducing formation difficulty of the second dielectric layer 112.

The step of forming the second dielectric layer 112 in the second opening 110 includes: forming a second dielectric material layer conformally covering the stack structure 102 and the second opening 110; and removing the second dielectric material layer exposed from the second opening 110, and using the remaining second dielectric material layer located in the second opening 110 as the second dielectric layer 112.

In some implementations, the second dielectric material layer is formed by using an ALD process. The ALD process includes a plurality of cycles of atomic layer deposition, and a thin film obtained by deposition may have a thickness of a single layer of atoms, so that a gap does not easily exist in the second dielectric material layer, and the second dielectric material layer can conformally cover a bottom surface and side walls of the second opening 110, thereby improving film formation quality of the second dielectric material layer and achieving relatively good formation quality of the second dielectric layer 112. In other implementations, the second dielectric material layer may alternatively be formed by using a CVD process.

In some implementations, the second dielectric material layer exposed from the second opening 110 is removed by using an isotropic etching process, and the remaining second dielectric material layer located in the second opening 110 is used as the second dielectric layer 112.

It should be noted that in the process of removing the second dielectric material layer exposed from the second opening 110, the first dielectric layer 111 exposed from the second opening 110 is further removed.

In some implementations, the isotropic etching process includes a wet etching process. The wet etching process has a high etching rate, simple operations, and low process costs.

It should be noted that a direction parallel to a surface of the substrate 100 and perpendicular to an extension direction of the stack structure 102 is a lateral direction, and in the step of forming the second dielectric layer 112, a lateral dimension of the second dielectric layer 112 should not be excessively large or small. If the lateral dimension of the second dielectric layer 112 is excessively large, correspondingly, the lateral dimension of the first dielectric layer 111 needs to be relatively small, the first dielectric layer 111 between the source/drain doped layer and the second dielectric layer 112 is not easily removed subsequently, and the corresponding groove is not easily formed. In a process of forming the contact plug, the contact plug is not easily formed between the second dielectric layer 112 and the source/drain doped layer. As a result, the contact plug is only in contact with the top surface of the source/drain doped layer and the side wall, which is away from the second dielectric layer 112, of the source/drain doped layer, a contact area between the contact plug and the source/drain doped layer is relatively small, and a contact resistance between the contact plug and the source/drain doped layer is relatively large, resulting in poor electrical performance of the semiconductor structure. In addition, the lateral dimension of the surface of the substrate 100 is excessively occupied, resulting in low plane utilization of the surface of the substrate 100, and reducing the integration degree of the semiconductor structure. If the lateral dimension of the second dielectric layer 112 is excessively small, the second dielectric layer 112 has a poor effect of electrically isolating the contact plug in the first region I from the contact plug in the second region II subsequently, and the contact plug in the first region I and the contact plug in the second region II are easily bridged, resulting in poor electrical performance of the semiconductor structure. In some implementations, the lateral dimension of the second dielectric layer 112 is 3 nm to 30 nm.

Forms of the method for forming a semiconductor structure further include: removing the bottom sacrificial layer 104 after the second dielectric layer 112 is formed; forming an isolation material layer on the fin 105, the isolation structure 109, and the cap layer 107 that are exposed by the stack structure 102 after the bottom sacrificial layer 104 is removed; and etching back the isolation material layer for a partial thickness, to form an isolation layer 126, where a top surface of the isolation layer 126 is lower than or flush with the bottom surface of the stack structure 102.

The isolation layer 126 is used for electrically isolating the fin 105 from the subsequently formed gate structure.

Figure 8:
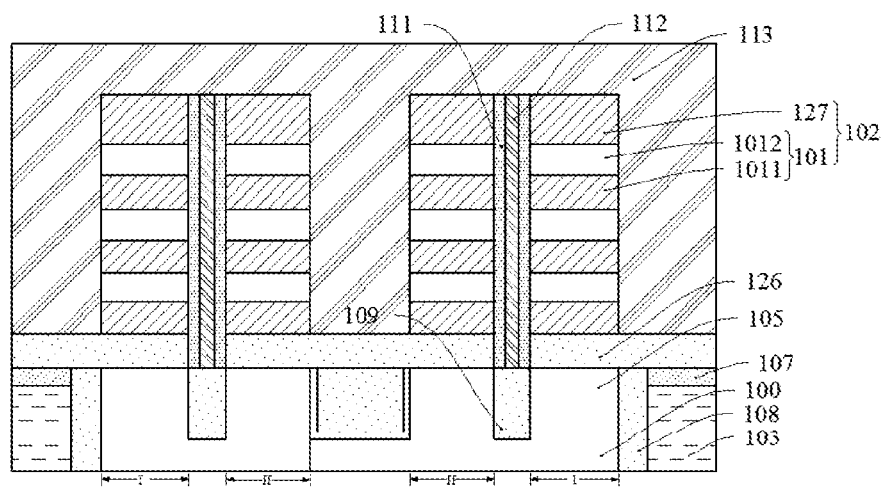

Referring to FIG. 8, forms of the method for forming a semiconductor structure include: forming a dummy gate structure 113 across the stack structures 102, the first dielectric layers 111, and the second dielectric layer 112 after the second dielectric layer 112 is formed and before the source/drain doped layer is formed, where the dummy gate structure 113 covers a part of top walls and a part of side walls of the stack structures 102.

The dummy gate structure 113 occupies a spatial position for forming a gate structure in the subsequent manufacture procedure.

In some implementations, the dummy gate structure 113 includes a dummy gate oxide layer (not shown in the figure) that conformally covers a part of top surfaces and a part of side walls of the channel stacks 101 and a dummy gate layer (not shown in the figure) located on the dummy gate oxide layer.

In some implementations, a material of the dummy gate oxide layer includes silicon oxide. In other implementations, a material of the dummy gate oxide layer may alternatively be silicon oxynitride.

In some implementations, a material of the dummy gate layer includes polysilicon. In other implementations, a material of the dummy gate layer may alternatively be amorphous carbon.

It should be noted that in the step of providing the substrate, gate spacer layers (not shown in the figure) is formed on side walls of the dummy gate structure 113.

The gate spacer layer is used for defining a forming position of the subsequently formed source/drain doped layer and further protecting the side wall of the dummy gate structure 113 from being damaged during subsequent formation of the semiconductor structure.

A material of the gate spacer layer includes one or more of silicon nitride, silicon oxynitride, silicon carbide, nitrogen silicon carbide, boron nitride, silicon boron nitride and carbon silicon boron nitride.

Referring to FIG. 9 to FIG. 14, a source/drain doped layer 114 and an interlayer dielectric layer 115 (as shown in FIG.

Figure 13:
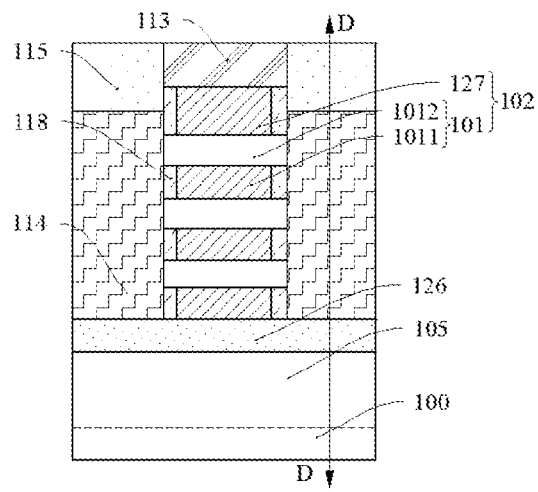

13) covering the source/drain doped layer 114 (as shown in FIG. 13) are formed in the stack structure 102.

When the semiconductor structure is working, the source/drain doped layer 114 is used for providing stress to a channel and increasing the mobility of carriers in the channel.

The second region II is used for forming an NMOS, and the source/drain doped layer 114 is used as a source and a drain of the NMOS. When the semiconductor structure is working, the source/drain doped layer 114 applies tensile stress to the channel. The electronic mobility can be improved by stretching the channel.

The first region I is used for forming a PMOS, and the source/drain doped layer 114 is used as a source and a drain of the PMOS. When the semiconductor structure is working, the source/drain doped layer 114 applies compression stress to the channel. The hole mobility can be improved by compressing the channel.

The interlayer dielectric layer 115 is used for electrically isolating adjacent devices.

In some implementations, a material of the interlayer dielectric layer 115 is an insulation material. Specifically, the material of the interlayer dielectric layer 115 includes silicon oxide. Silicon oxide is a low-cost dielectric material commonly used in the process, and has relatively high process compatibility, which is beneficial to reducing the process difficulty and process costs of forming the interlayer dielectric layer 115.

Specifically, the step of forming the source/drain doped layer 114 and the interlayer dielectric layer 115 includes the following.

Figure 9:
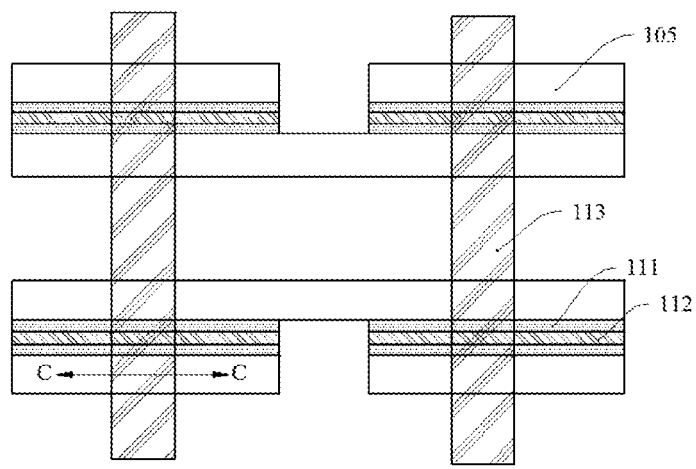
Figure 10:
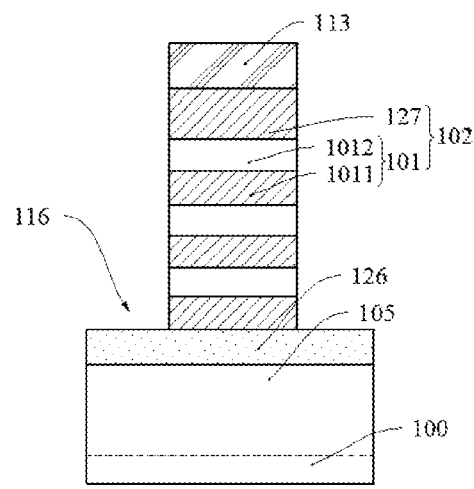

As shown in FIG. 9 and FIG. 10, FIG. 9 is a top view, and FIG. 10 is a cross-sectional view of FIG. 9 along line C-C. The step of forming the source/drain doped layer 114 includes: etching the stack structures 102 at two sides of the dummy gate structure 113 to form a source/drain opening 116.

The source/drain opening 116 provides a process space for subsequent formation of the source/drain doped layer. The source/drain opening 116 exposes the isolation layer 126.

In some implementations, the stack structures 102 at two sides of the dummy gate structure 113 are etched using a dry etching process to form the source/drain opening 116. The dry etching process has anisotropic etching characteristics and relatively good etching profile controllability, and can achieve graphic transformation with high accuracy, which is beneficial to enabling the shape of the source/drain opening 116 to meet the process requirements and is also beneficial to improving the removal efficiency of the stack structures 102. In the process of forming the source/drain opening 116 using the dry etching process, with the top of the isolation layer 126 as an etch stop position, damage to other film layers can be reduced. Moreover, by changing an etching gas, the sacrificial layer 1011 and the channel layer 1012 can be etched in the same etching device, which simplifies process steps.

Figure 11:
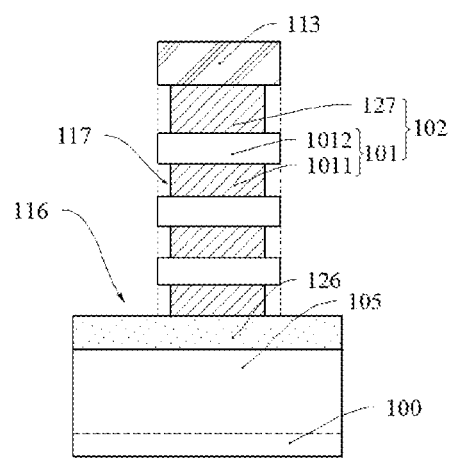

As shown in FIG. 11, the forming method of a semiconductor structure further includes: laterally etching the sacrificial layers 1011 exposed by the source/drain opening 116, to form side wall grooves 117.

The side wall groove 117 provides a process space for subsequent formation of an inner spacer layer.

In some implementations the sacrificial layers 1011 exposed by the source/drain opening 116 are removed using an isotropic etching process, to form the side wall grooves 117. Specifically, the isotropic etching process includes a wet etching process, and the wet etching process has a relatively high etching rate, simple operation, and low process costs.

Figure 12:
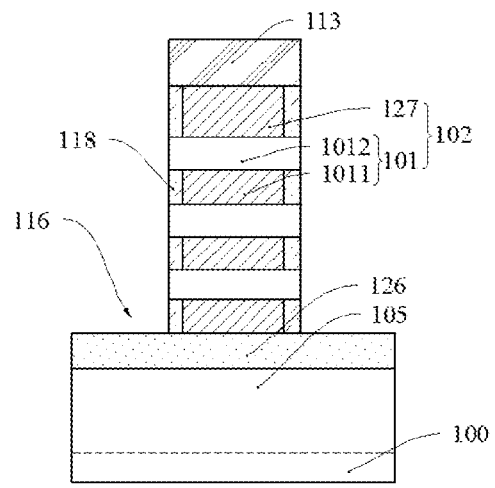

As shown in FIG. 12, an inner spacer layer 118 is formed in the side wall grooves 117.

The inner spacer layer 118 is used for electrically isolating the subsequently formed source/drain doped layer from the gate structure.

In some implementations a material of the inner spacer layer 118 is a low-k dielectric material. The low-k dielectric material refers to a dielectric material with a relative dielectric constant greater than or equal to 2.6 and less than or equal to 3.9. The low-k dielectric material has superior insulation performance. An electrical coupling effect between the source/drain doped layer and the gate structure that are subsequently formed on two sides of the inner spacer layer 118 can be reduced, thereby reducing the parasitic capacitance and improving the electrical performance of a transistor structure.

Specifically, a material of the inner spacer layer 118 includes SiON, SiBCN, SiCN, carbon-doped SiN, or oxygen-doped SiN. In some implementations, the material of the inner spacer layer 118 includes carbon-doped SiN or oxygen-doped SiN.

The step of forming the inner spacer layer 118 includes: forming a spacer material layer (not shown in the figure) conformally covering the source/drain opening 116, the side wall grooves 117, and the dummy gate structure 113; and removing the spacer material layer on the source/drain opening 116 and the surface of the dummy gate structure 113, and using the remaining spacer material layer located in the side wall grooves 117 as the inner spacer layer 118.

Figure 14:
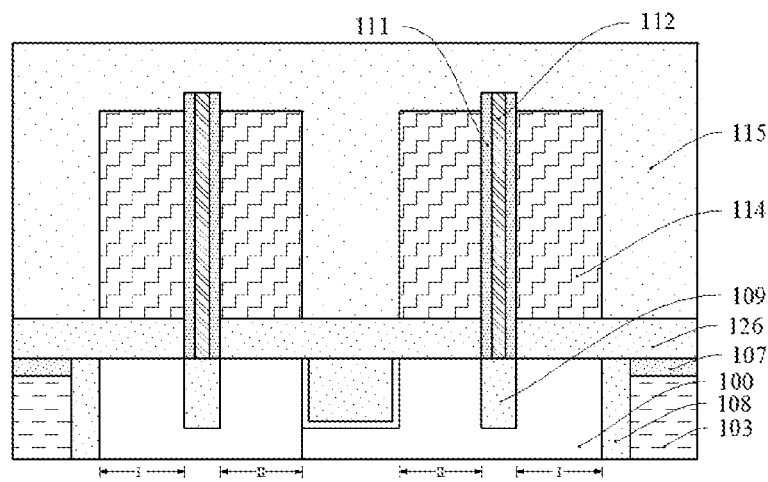

As shown in FIG. 13 and FIG. 14, FIG. 14 is a cross-sectional view of FIG. 13 along line D-D. An epitaxial layer is formed in the source/drain opening 116 using a selective epitaxy growth process, and in the process of forming the epitaxial layer, in-situ doping is performed on the epitaxial layer to form the source/drain doped layer 114.

Specifically, the source/drain doped layers 114 are formed in the stack structures 102 on two sides of the dummy gate structure 113.

The epitaxial layer is formed using the selective epitaxy process, to improve formation quality and purity of the epitaxial layer, thus helping to improve the adhesion between the epitaxial layer and the source/drain opening 116. The epitaxial layer obtained through the selective epitaxy growth method has high purity and few defects, which is beneficial to improving formation quality of the source/drain doped layer 114.

Still referring to FIG. 13 and FIG. 14, forms of a method for forming a semiconductor structure further include: forming the interlayer dielectric layer 115 covering side portions of the dummy gate structure 113 after the source/drain doped layer 114 is formed, where the interlayer dielectric layer 115 exposes the top of the dummy gate structure 113.

In some implementations the interlayer dielectric layer 115 is formed using a flowable chemical vapor deposition (FCVD) process. The FCVD process has good filling capability, and is beneficial to reducing a probability of defects such as empty holes in the interlayer dielectric layer 115, thereby improving film formation quality of the interlayer dielectric layer 115.

Figure 15:
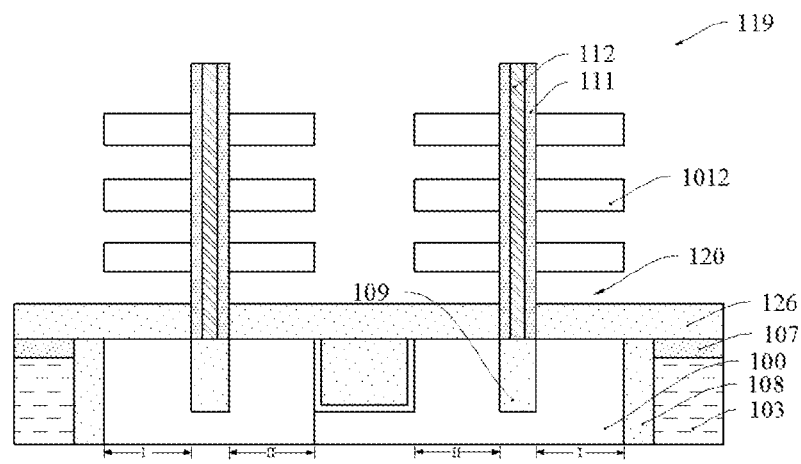
Figure 16:
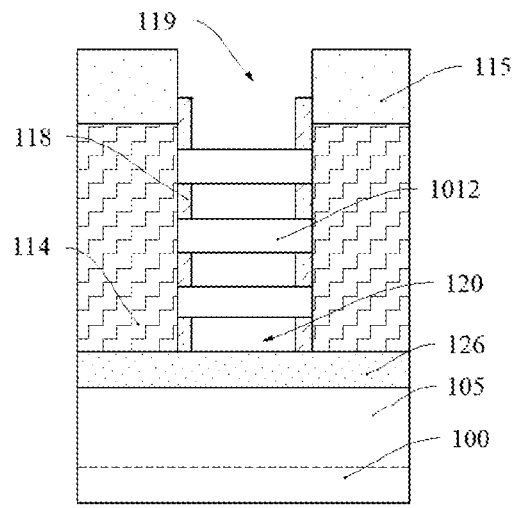

Referring to FIG. 15 and FIG. 16, forms of a method for forming a semiconductor structure further include: removing the dummy gate structure 113 after the interlayer dielectric layer 115 is formed, and forming a gate opening 119 in the interlayer dielectric layer 115.

The gate opening 119 provides a process space for subsequent formation of the gate structure.

In some implementations, the dummy gate structure 113 is removed using a wet etching process. The wet etching process has a high etching rate, simple operations, and low process costs.

In some implementations, the dummy gate structure 113 includes a dummy gate oxide layer and a dummy gate layer. A material of the dummy gate oxide layer includes silicon oxide, and a material of the dummy gate layer includes polysilicon. Specifically, in the step of removing the dummy gate structure 113, etching solutions used include ammonia and tetramethylammonium hydroxide solution.

It should be noted that forms of a method for forming a semiconductor structure further include: further removing the sacrificial layer 1011 after the dummy gate structure 113 is removed, to form a passage 120.

Specifically, in the process of removing the sacrificial layer 1011, the top sacrificial layer 127 is further removed. The passage 120 provides a process space for subsequent formation of the gate structure.

In some implementations the sacrificial layer 1011 and the top sacrificial layer 127 are removed by using a wet etching process. The wet etching process has a high etching rate, simple operations, and low process costs.

Specifically, a material of the sacrificial layer 1011 and a material of the top sacrificial layer 127 are silicon germanium. Correspondingly, in the process of removing the sacrificial layer 1011 and the top sacrificial layer 127 by using the wet etching process, an etching solution used is an HCl solution.

It should be noted that in the step of removing the dummy gate structure 113, an etching rate of the dummy gate structure 113 is greater than that of the channel layer 1012; and in the step of removing the sacrificial layer 1011 and the top sacrificial layer 127, etching rates of the sacrificial layer 1011 and the top sacrificial layer 127 are greater than that of the channel layer 1012, so that the channel layer 1012 is not easily damaged.

Figure 17:
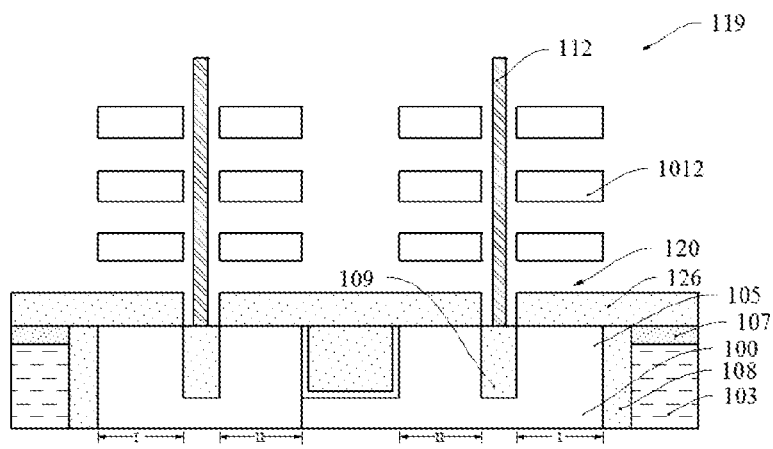

Referring to FIG. 17, forms of a method for forming a semiconductor structure include: removing the first dielectric layer 111 exposed by the gate opening 119 and the passage 120, to expose the side walls of the second dielectric layer 112.

The side walls of the second dielectric layer 112 are exposed to prepare for subsequent formation of third dielectric layers on the side walls of the second dielectric layer 112.

In some implementations, the first dielectric layer 111 exposed by the gate opening 119 and the passage 120 is removed using an isotropic dry etching process. The first dielectric layer 111 between the channel layer 1012 and the second dielectric layer 112 is easily removed using the isotropic dry etching process, to provide a process space for subsequently forming the third dielectric layer 122 between the second dielectric layer 112 and the channel layer 1012.

Figure 18:
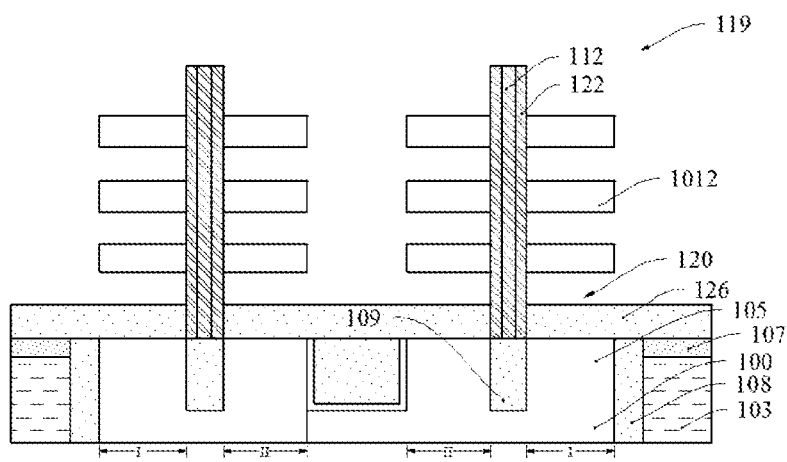

Referring to FIG. 18, the third dielectric layers 122 are formed on the side walls of the second dielectric layer 112.

The third dielectric layers 122 and the second dielectric layer 112 are used as a dielectric wall blocking the channel layer 1012 of the first region I and the channel layer 1012 of the second region II. Compared with the case of only the second dielectric layer, formation of the third dielectric layers can reduce a probability that the channel layer of the first region is bridged with the channel layer of the second region, thereby improving the electrical performance of the semiconductor structure.

Specifically, a material of the third dielectric layer 122 includes one or more of silicon nitride, silicon oxynitride, silicon carbide, silicon carbonitride, boron nitride, boron nitride silicon, and boron carbon silicon nitride. In some implementations, the material of the third dielectric layer 122 includes silicon nitride.

The step of forming the third dielectric layers 122 on the side walls of the second dielectric layer 112 includes: forming a third dielectric material layer (not shown in the figure) conformally covering the gate opening 119, the passage 120, and the second dielectric layer 112; and removing the third dielectric material layer in the gate opening 119 and the passage 120, and using the remaining third dielectric material layer located on the side walls of the second dielectric layer 112 as the third dielectric layers 122.

In some implementations, the third dielectric material layer is formed by using an ALD process. The ALD process includes a plurality of cycles of atomic layer deposition, which is beneficial to improving the thickness uniformity of the third dielectric material layer, so that the third dielectric material layer can conformally cover the gate opening 119, the passage 120, and the surface of the second dielectric layer 112. In addition, the ALD process has good gap filling performance and step coverage performance, and correspondingly improves a conformal coverage capability of the third dielectric material layer. In other implementations, the third dielectric material layer may alternatively be formed by using a CVD process.

In some implementations, the third dielectric material layer in the gate opening 119 and the passage 120 is removed by using a wet etching process. The wet etching process has a high etching rate, simple operations, and low process costs.

Figure 19:
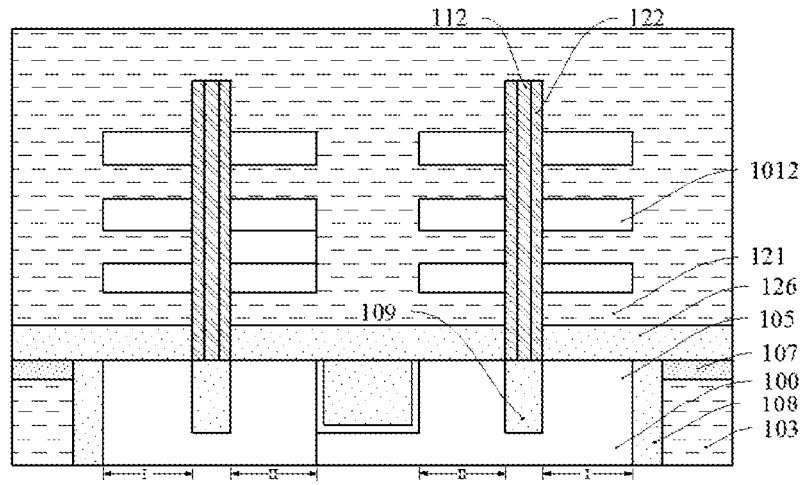
Figure 20:
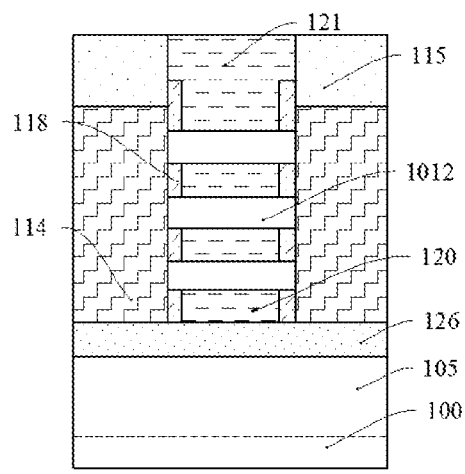

Referring to FIG. 19 and FIG. 20, a gate structure 121 is formed in the gate opening 119 and the passage 120.

When the semiconductor structure is working, the gate structure 121 is used for controlling turn-on and turn-off of the channel. The gate structure 121 is formed on the isolation layer 126.

In some implementations a material of the gate structure 121 includes a magnesium-tungsten alloy. In other implementations, the material of the gate structure may alternatively include W, Al, Cu, Ag, Au, Pt, Ni, Ti, or the like.

Correspondingly, in the step of forming the gate structure 121, the gate structure 121 is across the second dielectric layer 112 and the third dielectric layers 122.

Forms of a method for forming a semiconductor structure further include: forming a gate dielectric layer (not shown in the figure) in the gate opening 119 before the gate structure 121 is formed.

The gate dielectric layer is used for electrically isolating the gate structure 121 from the channel layer 1012. It should be noted that a material of the gate dielectric layer includes a high-k dielectric material. The high-k dielectric material refers to a dielectric material having a relative dielectric constant greater than a relative dielectric constant of silicon oxide.

In some implementations the material of the gate dielectric layer includes $HfO_2$. In other implementations, the material of the gate dielectric layer may alternatively be selected from one or more of $ZrO_2$, HfSiO, HfSiON, HfTaO, Hilo, HfZrO, or $Al_2O_3$.

Figure 21:
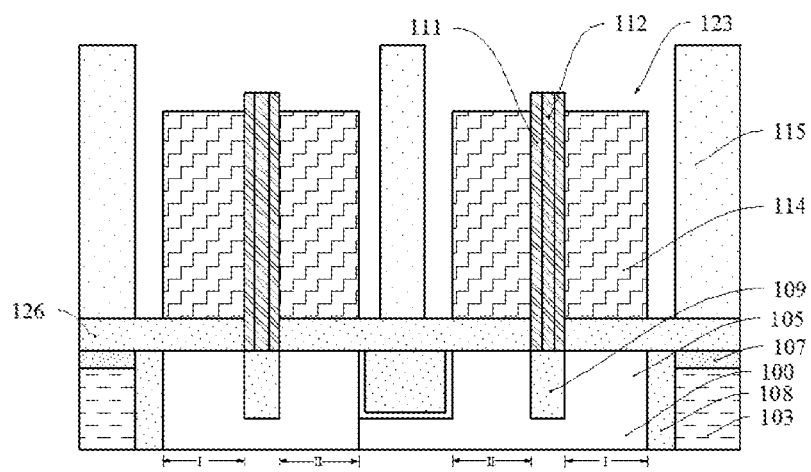

Referring to FIG. 21, the interlayer dielectric layer 115 is etched to form a trench 123, and the trench 123 exposes a top surface and a side wall, which is away from the second dielectric layer 112, of the source/drain doped layer 114. The trench 123 provides a process space for subsequent formation of the contact plug.

In some implementations, the interlayer dielectric layer 115 is etched using a dry etching process to form the trench 123. The dry etching process has anisotropic etching characteristics and relatively good etching profile controllability, and can achieve graphic transformation with high accuracy, which is beneficial to enabling the shape of the trench 123 to meet the process requirements and is also beneficial to improving the removal efficiency of the interlayer dielectric layer 115.

It should be noted that during formation of the trench 123, the trench 123 further exposes a side wall, which is away from the gate structure 121, of the source/drain doped layer 114.

The trench 123 exposes the side wall, which is away from the gate structure 121, of the source/drain doped layer 114. A contact plug subsequently formed in the trench 123 is in contact with the side wall, which is away from the gate structure 121, of the source/drain doped layer 114, and a contact area between the contact plug and the source/drain doped layer 114 is relatively large, which is beneficial to reducing a contact resistance.

Figure 22:
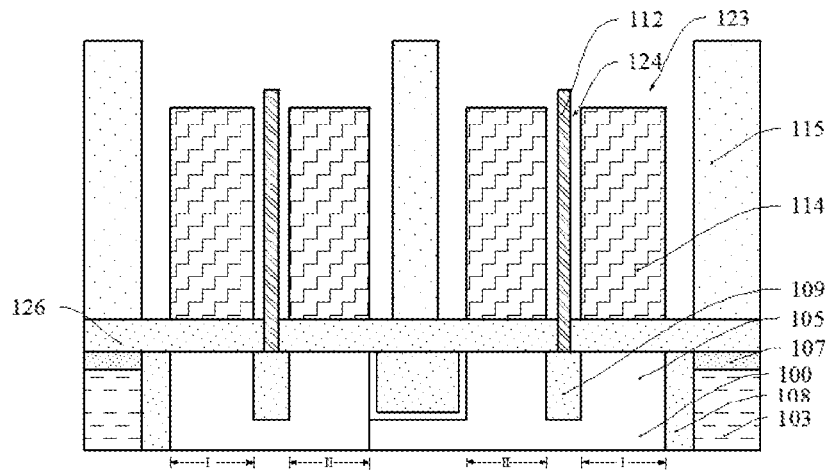

Referring to FIG. 22, after the trench 123 is formed, the first dielectric layer 111 between the source/drain doped layer 114 and the second dielectric layer 112 is removed, to form a groove 124, and the groove 124 exposes a side wall, which is close to the second dielectric layer 112, of the source/drain doped layer 114.

The trench 123 exposes a top surface and a side wall, which is away from the second dielectric layer 112, of the source/drain doped layer 114, the first dielectric layer 111 between the source/drain doped layer 114 and the second dielectric layer 112 is removed to form a groove 124, and the groove 124 exposes a side wall, which is close to the second dielectric layer 112, of the source/drain doped layer 114. In a process of forming a contact plug in the trench 123 and the groove 124, the contact plug is in contact with the top surface of the source/drain doped layer 114 as well as the side walls, which are close to the second dielectric layer 112 and away from the second dielectric layer 112 respectively, of the source/drain doped layer 114. There is a relatively large contact area between the contact plug and the source/drain doped layer 114, so that a contact resistance between the contact plug and the source/drain doped layer 114 is relatively small, thereby improving the electrical performance of the semiconductor structure.

In some implementations, the first dielectric layer 111 between the source/drain doped layer 114 and the second dielectric layer 112 is removed using a dry etching process, to form the groove 124, and the groove 124 exposes the side wall, which is close to the second dielectric layer 112, of the source/drain doped layer 114. The dry etching process has anisotropic etching characteristics and relatively good etching profile controllability, and can achieve graphic transformation with high accuracy. The second dielectric layer 112 is not easily damaged while the first dielectric layer 111 is removed. Moreover, the dry etching process is further beneficial to improving the removal efficiency of the first dielectric layer 111.

In some implementations the material of the first dielectric layer 111 includes silicon oxide. Correspondingly, in the process of removing the first dielectric layer 111 between the source/drain doped layer 114 and the second dielectric layer 112 by using the dry etching, an etching gas used includes hydrogen fluoride.

It should be noted that in some implementations, the material of the isolation structure 109 includes silicon oxide, and the material of the first dielectric layer 111 includes silicon oxide. The density of the first dielectric layer 111 is less than that of the isolation structure 109, so that in the step of removing the first dielectric layer 111, the isolation structure 109 is not easily damaged.

Figure 23:
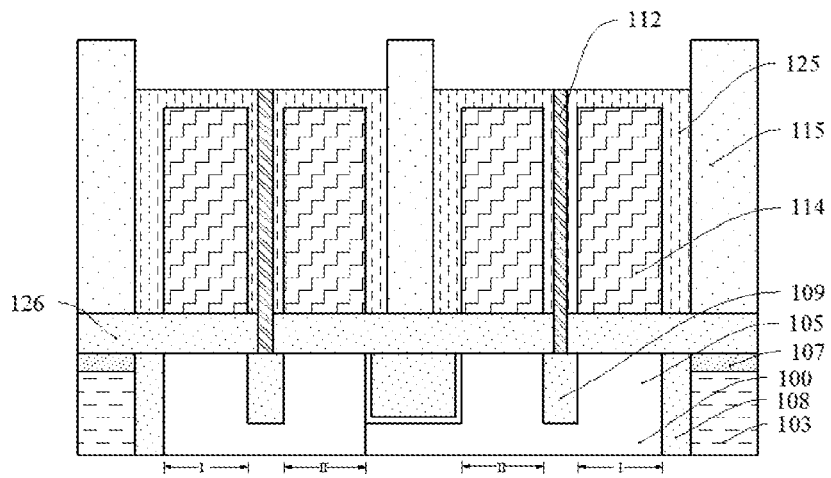

Referring to FIG. 23, a contact plug 125 is formed in the trench 123 and the groove 124.

The contact plug 125 is used for connecting the source/drain doped layer 114 and a BEOL metal. Therefore, in a process of forming the contact plug 125 in the trench 123 and the groove 124, the contact plug 125 is formed between the source/drain doped layer 114 and the second dielectric layer 112, on the top surface of the source/drain doped layer 114 and the side wall, which is away from the second dielectric layer 112, of the source/drain doped layer 114. There is a relatively large contact area between the contact plug 125 and the source/drain doped layer 114, so that a contact resistance between the contact plug 125 and the source/drain doped layer 114 is relatively small, thereby improving the electrical performance of the semiconductor structure.

A material of the contact plug 125 is a conductive material. Specifically, the conductive material includes one or more of W, Co, Cu, and Al. In some implementations, the material of the contact plug 125 is W. W has stable chemical properties and a mature formation process, which is beneficial to controlling formation quality of the semiconductor structure and improving a formation rate of the semiconductor structure.

It should be noted that in some implementations, a top surface of the contact plug 125 is lower than or flush with the top of the second dielectric layer 112.

The step of forming the contact plug 125 includes: forming a conductive material layer (not shown in the figure) in the trench 123 and the groove 124; and removing the conductive material layer higher than the second dielectric layer 112, and using the remaining conductive material layer as the contact plug 125.

It should be noted that the trench 123 further exposes the side wall, which is away from the gate structure 121, of the source/drain doped layer 114, and the contact plug 125 is further in contact with the side wall, which is away from the gate structure 121, of the source/drain doped layer 114 correspondingly.

Figure 24:
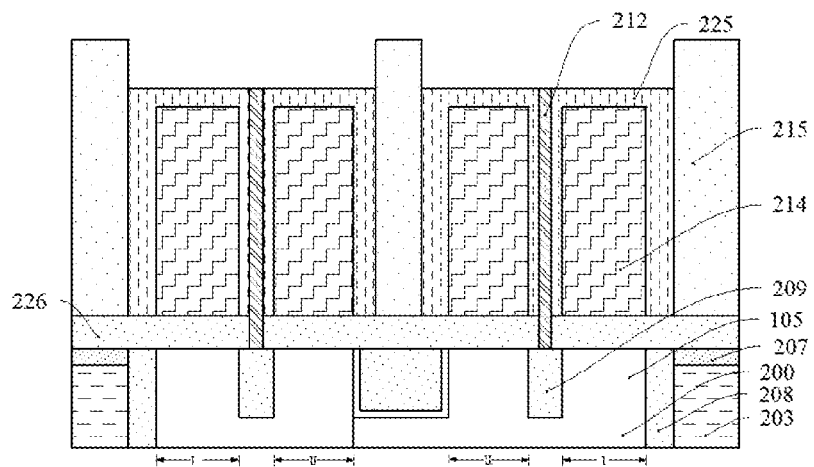
FIG. 24 and FIG. 25 are schematic structural diagrams of one form of a semiconductor structure according to the present disclosure.
Figure 25:
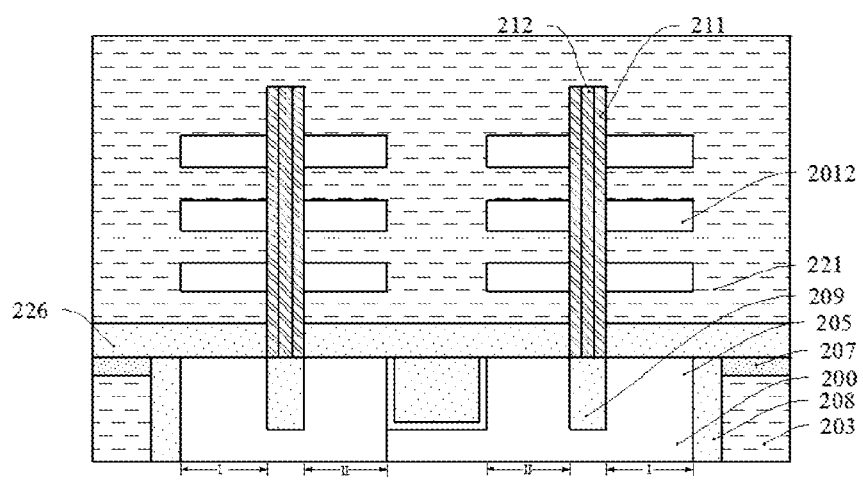

The present disclosure further provides forms of a semiconductor structure. Referring to FIG. 24 and FIG. 25, FIG. 24 is a cross-sectional view taken at a source/drain doped layer parallel to an extension direction of a gate structure, and FIG. 25 is a cross-sectional view taken at a gate structure parallel to an extension direction of the gate structure. FIG. 24 and FIG. 25 show schematic structural diagrams of an embodiment of a semiconductor structure according to the present invention.

Forms of a semiconductor structure include: a substrate 200, where the substrate 200 includes a first region I and a second region II that are spaced apart; a first dielectric wall 212, located in the first region I and the second region II of the substrate 200; source/drain doped layers 214, separated on the substrate 200 of the first region I and the second region II along an extension direction of the first dielectric wall 212, where the source/drain doped layers 214 are spaced apart from the first dielectric wall 212; and a contact plug 225, located between the source/drain doped layer 214 and the first dielectric wall 212 and covering a top surface of the source/drain doped layer 214 and a side wall, which is away from the first dielectric wall 212, of the source/drain doped layer 214.

In the semiconductor structure provided in forms of the present disclosure, the source/drain doped layers 214 are separated on the substrate 200 of the first region I and the second region II along the extension direction of the first dielectric wall 212, and the source/drain doped layers 214 are spaced apart from the first dielectric wall 212; and the contact plug 225 is located between the source/drain doped layer 214 and the first dielectric wall 212 and covers the top surface of the source/drain doped layer 214 and the side wall, which is away from the first dielectric wall 212, of the source/drain doped layer 214. Compared with a case in which the contact plug only covers the top surface of the source/drain doped layer and the side wall, which is away from the first dielectric wall, of the source/drain doped layer, in this form of the present disclosure, there is a relatively large contact area between the contact plug 225 and the source/drain doped layer 214, so that a contact resistance between the contact plug 225 and the source/drain doped layer 214 is relatively small, thereby improving the electrical performance of the semiconductor structure.

In some implementations, the first region I is used for forming a first-type transistor thereon, and the second region II is used for forming a second-type transistor thereon. Conductivity types of the first-type transistor and the second-type transistor are different. Specifically, the first-type transistor is a positive channel metal oxide semiconductor (PMOS), and the second-type transistor is a negative channel metal oxide semiconductor (NMOS).

In some implementations, the substrate 200 is a silicon substrate. In other implementations, a material of the substrate may alternatively be germanium, silicon germanide, silicon carbide, gallium arsenide, indium gallide, or the like. The substrate may alternatively be a substrate of another type, such as a silicon substrate on an insulator or a germanium substrate on an insulator.

It should be noted that the substrate 200 includes a plurality of spaced device regions, and the first region I and the second region II are located in the device region. In some implementations, regions close to each other in adjacent device regions are both first regions I or both second regions II. In other implementations, one of the regions close to each other in the adjacent device regions may alternatively be a first region and the other may be a second region.

In the process of forming the semiconductor structure, the first dielectric wall 212 is used for electrically isolating the contact plug 225 in the first region I from the contact plug 225 in the second region II, so that the contact plug 225 in the first region I and the contact plug 225 in the second region II are not easily bridged, thereby improving the electrical performance of the semiconductor structure.

Specifically, a material of the first dielectric wall 212 includes one or more of silicon nitride, silicon oxynitride, silicon carbide, silicon carbonitride, boron nitride, boron nitride silicon, and boron carbon silicon nitride. In some implementations, the material of the first dielectric wall 212 includes silicon nitride, and silicon nitride is a dielectric material commonly used in the process, thereby improving process compatibility of the first dielectric wall 212 and reducing formation difficulty of the first dielectric wall 212.

It should be noted that a direction parallel to a surface of the substrate 200 and perpendicular to an extension direction of the first dielectric wall 212 is a lateral direction, and a lateral dimension of the first dielectric wall 212 should not be excessively large or small. With an excessively large lateral dimension, the first dielectric wall 212 occupies an excessive portion of the lateral dimension of the surface of the substrate 200, resulting in low plane utilization of the surface of the substrate 200, and reducing the integration degree of the semiconductor structure. In addition, with an excessively large lateral dimension, the first dielectric wall 212 occupies an excessively large lateral region between the source/drain doped layer 214 of the first region I and the source/drain doped layer 214 of the second region II, resulting in a relatively small lateral dimension of the contact plug 225 between the source/drain doped layer 214 and the first dielectric wall 212, making it difficult to form the contact plug 225 between the source/drain doped layer 214 and the first dielectric wall 212. The contact plug 225 between the source/drain doped layer 214 and the first dielectric wall 212 has a poor effect of reducing a contact resistance between the source/drain doped layer 214 and the contact plug 225. As a result, it is difficult for the semiconductor structure to meet a process requirement. If the lateral dimension of the first dielectric wall 212 is excessively small, the first dielectric wall 212 has a relatively poor effect of electrically isolating the contact plug 225 in the first region I from the contact plug 225 in the second region II, and the contact plug 225 in the first region I and the contact plug 225 in the second region II are easily bridged, resulting in poor electrical performance of the semiconductor structure. In some implementations, the lateral dimension of the first dielectric wall 212 is 3 nm to 30 nm.

The source/drain doped layer 214 and the first dielectric wall 212 are spaced apart, so that the contact plug 225 can be formed between the source/drain doped layer 214 and the first dielectric wall 212.

When the semiconductor structure is working, the source/drain doped layer 214 is used for providing stress to a channel and increasing the mobility of carriers in the channel.

The second region II is used for forming NMOS, and the source/drain doped layer 214 is used as a source and a drain of the NMOS. When the semiconductor structure is working, the source/drain doped layer 214 applies tensile stress to the channel. The electronic mobility can be improved by stretching the channel.

The first region I is used for forming PMOS, and the source/drain doped layer 214 is used as a source and a drain of the PMOS. When the semiconductor structure is working, the source/drain doped layer 214 applies compression stress to the channel. The hole mobility can be improved by compressing the channel.

The contact plug 225 is used for connecting the source/drain doped layer 214 and a BEOL metal.

The contact plug 225 is located between the source/drain doped layer 214 and the first dielectric wall 212 and covers the top surface of the source/drain doped layer 214 and the side wall, which is away from the first dielectric wall 212, of the source/drain doped layer 214. In some implementations, compared with a case in which the contact plug only covers the top surface of the source/drain doped layer and the side wall, which is away from the first dielectric wall, of the source/drain doped layer, in this form of the present disclosure, there is a relatively large contact area between the contact plug 225 and the source/drain doped layer 214, so that a contact resistance between the contact plug 225 and the source/drain doped layer 214 is relatively small, thereby improving the electrical performance of the semiconductor structure.

A material of the contact plug 225 is a conductive material. Specifically, the conductive material includes one or more of W, Co, Cu, and Al. In some implementations, the material of the contact plug 225 is W. W has stable chemical properties and a mature formation process, which is beneficial to controlling formation quality of the semiconductor structure and improving a formation rate of the semiconductor structure.

It should be noted that a lateral dimension of the contact plug 225 between the source/drain doped layer 214 and the first dielectric wall 212 should not be excessively large or small. If the lateral dimension is excessively large, an excessive portion of the lateral dimension of the surface of the substrate 200 is occupied, resulting in low plane utilization of the surface of the substrate 200 and reducing the integration degree of the semiconductor structure. In addition, if the lateral dimension is excessively large, a formation region of the first dielectric wall 212 is occupied. As a result, it is difficult for the lateral dimension of the first dielectric wall 212 to meet a process requirement. The first dielectric wall 212 has a relatively poor effect of electrically isolating the contact plug 225 in the first region I from the contact plug 225 in the second region II, and the contact plug 225 in the first region I and the contact plug 225 in the second region II are easily bridged, resulting in poor electrical performance of the semiconductor structure. If the lateral dimension is excessively small, the lateral dimension of the contact plug 225 between the source/drain doped layer 214 and the first dielectric wall 212 is relatively small; it is difficult to form the contact plug 225 between the source/drain doped layer 214 and the first dielectric wall 212, and the formation quality of the contact plug 225 is relatively poor. The contact plug 225 between the source/drain doped layer 214 and the first dielectric wall 212 has a poor effect of reducing a contact resistance between the source/drain doped layer 214 and the contact plug 225, making it difficult for the semiconductor structure to meet a process requirement. In some implementations, the lateral dimension of the contact plug 225 between the source/drain doped layer 214 and the first dielectric wall 212 is 3 nm to 20 nm.

It should be noted that in some implementations, a top surface of the contact plug 225 is lower than or flush with the top of the first dielectric wall 212.

It should be noted that the contact plug 225 is further in contact with the side wall, which is away from the gate structure 121, of the source/drain doped layer 114.

The semiconductor structure further includes: a plurality of channel layers 2012, suspended above the substrate 200, where two ends of the channel layer 2012 are connected to the source/drain doped layer 214 and the plurality of channel layers 2012 are spaced apart in a normal direction of a surface of the substrate 200.

When the semiconductor structure is working, the channel layer 2012 is used as a channel region.

In some implementations, a material of the channel layer 2012 includes silicon. In other implementations, the material of the channel layer may alternatively include germanium, silicon germanium, silicon carbide, gallium arsenide, indium gallium or the like.

The semiconductor structure further includes: a second dielectric wall 211, located between the first dielectric wall 212 and the channel layer 2012.

The second dielectric wall 211 and the first dielectric wall 212 are used for electrically isolating the channel layer 2012 in the first region I from the channel layer 2012 in the second region II, so that the channel layer 2012 in the first region I and the channel layer 2012 in the second region II are not easily bridged, thereby improving the electrical performance of the semiconductor structure.

Specifically, a material of the second dielectric wall 211 includes one or more of silicon nitride, silicon oxynitride, silicon carbide, silicon carbonitride, boron nitride, boron nitride silicon, and boron carbon silicon nitride. In some implementations, the material of the second dielectric wall 211 includes silicon nitride.

It should be noted that a lateral dimension of the second dielectric wall 211 is the same as the lateral dimension of the contact plug 225 between the source/drain doped layer 214 and the first dielectric wall 212, and is 3 nm to 20 nm.

The semiconductor structure further includes: a gate structure 221, across the plurality of channel layers 2012, the first dielectric wall 212, and the second dielectric wall and covering the channel layers 2012.

When the semiconductor structure is working, the gate structure 221 is used for controlling turn-on and turn-off of the channel. Three surfaces of the gate structure 221 enclose the channel layer 2012, and a capability of the gate structure 221 for controlling the channel is relatively strong.

In some implementations, a material of the gate structure 221 includes a magnesium-tungsten alloy. In other implementations, the material of the gate structure may alternatively include W, Al, Cu, Ag, Au, Pt, Ni, Ti, or the like.

The semiconductor structure further includes: a gate dielectric layer (not shown in the figure), located between the gate structure 221 and the channel layer 2012.

The gate dielectric layer is used for electrically isolating the gate structure 221 from the channel layer 2012. It should be noted that a material of the gate dielectric layer includes a high-k dielectric material. The high-k dielectric material refers to a dielectric material having a relative dielectric constant greater than a relative dielectric constant of silicon oxide.

In some implementations, the material of the gate dielectric layer includes $HfO_2$. In other implementations, the material of the gate dielectric layer may alternatively be selected from one or more of $ZrO_2$, HfSiO, HfSiON, HfTaO, HfTiO, HfZrO, or $Al_2O_3$.

The semiconductor structure further includes an inner spacer layer (not shown in the figure), located between the source/drain doped layer 214 and the gate structure 221.

The inner spacer layer is used for electrically isolating the source/drain doped layer 214 from the gate structure 221.

In some implementations, a material of the inner spacer layer includes a low-k dielectric material. The low-k dielectric material refers to a dielectric material with a relative dielectric constant greater than or equal to 2.6 and less than or equal to 3.9. The low-k dielectric material has superior insulation performance. An electrical coupling effect between the source/drain doped layer 214 and the gate structure 221 that are located on two sides of the inner spacer layer can be reduced, thereby reducing the parasitic capacitance and improving the electrical performance of a transistor structure.

Specifically, a material of the inner spacer layer includes SiON, SiBCN, SiCN, carbon-doped SiN, or oxygen-doped SiN. In some implementations, the material of the inner spacer layer includes carbon-doped SiN or oxygen-doped SiN.

The semiconductor structure further includes an interlayer dielectric layer 215, covering the side wall of the contact plug 225.

The interlayer dielectric layer 215 is used for electrically isolating adjacent devices.

In some implementations, a material of the interlayer dielectric layer 215 includes an insulation material. Specifically, the material of the interlayer dielectric layer 215 includes silicon oxide. Silicon oxide is a low-cost dielectric material commonly used in the process, and has relatively high process compatibility, which is beneficial to reducing the process difficulty and process costs of forming the interlayer dielectric layer 215.

Forms of the semiconductor structure further include: fins 205, located between the gate structure 221 and the substrate 200.

In some implementations, a material of the fins 205 is the same as the material of the substrate 200. In other implementations, the material of the fins may alternatively be different from the material of the substrate.

In some implementations, the semiconductor structure further includes: a power rail line 203, located in the substrate 200, where the power rail line 203 is an elongated-shaped structure, and the power rail line 203 is parallel to an extension direction of the first dielectric wall 212.

The power rail line 203 is used for supplying power to different components of a chip. In some implementations, the power rail line 203 is located in the substrate 200. The power rail line 203 is a buried power rail (BPR), which is beneficial to releasing wiring resources that are interconnected in a BEOL and reducing a height of a standard cell, to meet a requirement of continuous miniaturization of logic chips. In addition, the BPR uses a technology of increasing a BEOL resistance by reducing a pitch, which is also beneficial to providing a lower resistive local distribution of the current.

A material of the power rail line 203 is a conductive material. In some implementations, the material of the power rail line 203 is a metal material, including one or more of Co, W, Ni, and Ru. The material of the power rail line 203 has a relatively low resistivity, which is beneficial to alleviating RC delay and improving a processing speed of a chip. In some implementations, a cap layer 207 is formed on the top of the power rail line 203. The cap layer 207 is used for protecting the power rail line 203 from being easily damaged.

Specifically, a material of the cap layer 207 includes one or more of silicon nitride, silicon oxynitride, silicon carbide, silicon carbonitride, boron nitride, boron nitride silicon, and boron carbon silicon nitride. In some implementations, the material of the cap layer 207 includes silicon nitride.

In some implementations, an insulation layer 208 is further formed between a side wall of the power rail line 203 and the substrate 200, and the insulation layer 208 is used for implementing insulation between the power rail line 203 and the substrate 200. Therefore, a material of the insulation layer 208 is an insulation material, for example, silicon oxide, silicon oxynitride, or silicon nitride.

The semiconductor structure may be formed using the forming method in the foregoing implementations, or may be formed by using another forming method. For specific descriptions for the semiconductor structure in this form, reference may be made to corresponding descriptions in the foregoing implementations as details are not described herein again. Although embodiments and implementations of the present disclosure are disclosed above, the present disclosure is not limited thereto.

What is claimed is:

1. A forming method of a semiconductor structure, comprising:
   providing a substrate, wherein the substrate comprises:
   a first region and a second region that are spaced apart, stack structures that are formed on the first region and the second region, and
   a first opening formed between the stack structure of the first region and the stack structure of the second region;
   forming first dielectric layers on side walls of the first opening, wherein a second opening is provided between the first dielectric layers;
   forming a second dielectric layer in the second opening;
   forming a source/drain doped layer and an interlayer dielectric layer covering the source/drain doped layer in the stack structure after the second dielectric layer is formed;
   etching the interlayer dielectric layer to form a trench, wherein the trench exposes a top surface and a side wall, which is away from the second dielectric layer, of the source/drain doped layer;
   removing the first dielectric layer between the source/drain doped layer and the second dielectric layer after the trench is formed, to form a groove; and
   forming a contact plug in the trench and the groove.

2. The forming method of a semiconductor structure according to claim 1, wherein in the step of forming the first dielectric layers on the side walls of the first opening, the first dielectric layer is further formed on a bottom surface of the first opening.

3. The forming method of a semiconductor structure according to claim 1, wherein the step of forming the first dielectric layers comprises:
   forming a first dielectric material layer that conformally covers the side walls and a bottom surface of the first opening; and
   removing the first dielectric material layer on the bottom surface of the first opening, and using the remaining first dielectric material layer on the side walls of the first opening as the first dielectric layers.

4. The forming method of a semiconductor structure according to claim 3, wherein the first dielectric material layer is formed using an atomic layer deposition process or a chemical vapor deposition process.

5. The forming method of a semiconductor structure according to claim 3, wherein the first dielectric material layer on the bottom surface of the first opening is removed using a dry etching process.

6. The forming method of a semiconductor structure according to claim 1, wherein:
   a direction parallel to a surface of the substrate and perpendicular to an extension direction of the stack structure is a lateral direction; and
   in the step of forming the first dielectric layers, a lateral dimension of the first dielectric layer is 3 nm to 20 nm.

7. The forming method of a semiconductor structure according to claim 1, wherein a material of the first dielectric layer comprises at least one of silicon oxide or silicon oxynitride.

8. The forming method of a semiconductor structure according to claim 1, wherein the step of forming the second dielectric layer in the second opening comprises:
   forming a second dielectric material layer that conformally covers the stack structure and the second opening; and
   removing the second dielectric material layer exposed from the second opening, and using the remaining second dielectric material layer located in the second opening as the second dielectric layer.

9. The forming method of a semiconductor structure according to claim 8, wherein the second dielectric material layer is formed using an atomic layer deposition process or a chemical vapor deposition process.

10. The forming method of a semiconductor structure according to claim 1, wherein:

a direction parallel to a surface of the substrate and perpendicular to an extension direction of the stack structure is a lateral direction; and in the step of forming the second dielectric layer, a lateral dimension of the second dielectric layer is 3 nm to 30 nm.

11. The forming method of a semiconductor structure according to claim 1, wherein a material of the second dielectric layer comprises at least one of silicon nitride, silicon oxynitride, silicon carbide, silicon carbonitride, boron nitride, boron nitride silicon, or boron carbon silicon nitride.

12. The forming method of a semiconductor structure according to claim 1, wherein the first dielectric layer between the source/drain doped layer and the second dielectric layer is removed using a dry etching process, to form the groove.

13. The forming method of a semiconductor structure according to claim 1, wherein:

in the step of providing the substrate, the each of the stack structures comprises a plurality of channel stacks, where each channel stack comprises a sacrificial layer and a channel layer located on the sacrificial layer;

the forming method of a semiconductor structure comprises: forming a dummy gate structure across the stack structures, the first dielectric layers, and the second dielectric layer after the second dielectric layer is formed and before the source/drain doped layer is formed, wherein the dummy gate structure covers a part of top walls and a part of side walls of the stack structures;

the step of forming the source/drain doped layer comprises: forming the source/drain doped layer in the stack structure on two sides of the dummy gate structure; and the forming method of a semiconductor structure further comprises: removing the dummy gate structure after the interlayer dielectric layer is formed, and forming a gate opening in the interlayer dielectric layer; removing the sacrificial layer to form a passage; and forming a gate structure in the gate opening and the passage.

14. The forming method of a semiconductor structure according to claim 13, comprising:

removing the first dielectric layer that is exposed by the gate opening and the passage after the gate opening is formed and before the gate structure is formed, and exposing side walls of the second dielectric layer;

forming third dielectric layers on the side walls of the second dielectric layer;

wherein in the step of forming the gate structure, the gate structure is across the second dielectric layer and the third dielectric layers.

15. The forming method of a semiconductor structure according to claim 14, wherein the first dielectric layers that are exposed by the gate opening and the passage is removed using an isotropic etching process, to expose the side walls of the second dielectric layer.

16. The forming method of a semiconductor structure according to claim 14, wherein a material of the third dielectric layer comprises at least one of silicon nitride, silicon oxynitride, silicon carbide, silicon carbonitride, boron nitride, boron nitride silicon, or boron carbon silicon nitride.

17. The forming method of a semiconductor structure according to claim 14, wherein the step of forming the third dielectric layers on the side walls of the second dielectric layer comprises:

forming a third dielectric material layer that conformally covers the gate opening, the passage, and the second dielectric layer; and removing the third dielectric material layer in the gate opening and the passage, and using the remaining third dielectric material layer located on the side walls of the second dielectric layer as the third dielectric layers.

18. The forming method of a semiconductor structure according to claim 17, wherein the third dielectric material layer is formed using a chemical vapor deposition process or an atomic layer deposition process.

19. The forming method of a semiconductor structure according to claim 17, wherein the third dielectric material layer in the gate opening is removed using a wet etching process.

* * * * *